(12) United States Patent
Kim et al.

(10) Patent No.: US 7,504,140 B2
(45) Date of Patent: Mar. 17, 2009

(54) THERMAL TRANSFER ELEMENT

(75) Inventors: Mu-Hyun Kim, Suwon-si (KR);
Byung-Doo Chin, Suwon-si (KR);
Min-Chul Suh, Suwon-si (KR);
Nam-Choul Yang, Suwon-si (KR);
Seong-Taek Lee, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 484 days.

(21) Appl. No.: 11/014,211

(22) Filed: Dec. 17, 2004

(65) Prior Publication Data

US 2005/0186366 A1    Aug. 25, 2005

(30) Foreign Application Priority Data

Feb. 24, 2004    (KR) .................... 10-2004-0012397

(51) Int. Cl.
*B41M 5/46*    (2006.01)
(52) U.S. Cl. .................. 428/32.77; 428/32.81
(58) Field of Classification Search ........... None
See application file for complete search history.

(56) References Cited

U.S. PATENT DOCUMENTS

| | | | |
|---|---|---|---|
| 4,758,765 A * | 7/1988 | Mitsumori | ............ 313/506 |
| 5,220,348 A | 6/1993 | D'Aurelio | |
| 5,256,506 A | 10/1993 | Ellis | |
| 5,278,023 A | 1/1994 | Bills | |
| 5,308,737 A | 5/1994 | Bills | |
| 5,725,989 A | 3/1998 | Chang | |
| 6,114,088 A | 9/2000 | Wolk et al. | |
| 6,284,425 B1 | 9/2001 | Staral et al. | |
| 6,696,786 B2 * | 2/2004 | Burrows | ............ 313/506 |

FOREIGN PATENT DOCUMENTS

| WO | WO 03/017732 | 2/2003 |
|---|---|---|
| WO | WO 03/089542 | 10/2003 |

OTHER PUBLICATIONS

Office Action from the Japanese Patent Office issued in Applicant's corresponding Japanese Patent Application No. 2004-378025 dated Jan. 8, 2008.

* cited by examiner

*Primary Examiner*—Bruce H Hess
(74) *Attorney, Agent, or Firm*—Robert E. Bushnell, Esq.

(57) ABSTRACT

A thermal transfer element is capable of improving transfer characteristics because transfer is performed at a low temperature. The thermal transfer element includes: a base substrate as a support substrate; a light-to-heat conversion layer formed on the base substrate to convert incident light to thermal energy; a transfer layer formed on the light-to-heat conversion layer to form an image; and a release layer formed between the base substrate and the light-to-heat conversion layer to facilitate delamination of the light-to-heat conversion layer from the base substrate. The release layer includes a silicon polymer having a glass transition temperature (Tg) of 25° C. or less, and low surface energy. In a further embodiment, the thermal transfer element includes an interlayer formed between the light-to-heat conversion layer and the transfer layer to protect the light-to-heat conversion layer.

19 Claims, 2 Drawing Sheets

THERMAL TRANSFER ELEMENT

CLAIM OF PRIORITY

This application makes reference to, incorporates the same herein, and claims all benefits accruing under 35 U.S.C. §119 from an application for earlier filed in the Korean Intellectual Property Office on 24 Feb. 2004 and there duly assigned Serial No. 2004-12397.

BACKGROUND OF THE INVENTION

1. Field of the Invention

The present invention relates to a thermal transfer element and, more particularly, to a thermal transfer element capable of improving transfer characteristics by performing thermal transfer at a low temperature.

2. Description of the Related Art

In general, an organic electroluminescent display device (OLED) includes an anode electrode formed on an insulating substrate as a lower electrode, an organic thin film layer formed on the anode electrode, and a cathode electrode formed on the organic thin film layer as an upper electrode. The organic thin film layer includes at least one of a hole injection layer, a hole transport layer, an emission layer, a hole blocking layer, an electron transport layer and an electron injection layer.

A method of forming the organic thin film layer may be a deposition method or a lithography method. The deposition method is a method of forming an organic emission layer by vacuum depositing an organic electroluminescent material using a shadow mask, but it is difficult to form a fine pattern due to deformation of the mask and difficulty in applying it to a large-sized display device. The lithography method is a method of forming an organic emission layer by depositing an organic electroluminescent material and then patterning the organic electroluminescent material using a photoresist material, and this method is capable of forming a fine pattern. However, the lithography method has the problem of deterioration of the characteristics of the organic emission layer due to use of a developer or an etchant of the organic electroluminescent material used to form a photoresist pattern.

In order to solve these problems, an inkjet method for directly patterning an organic emission layer has been proposed. The inkjet method is a method of forming an organic emission layer by ejecting an electroluminescent material solved or dispersed in solvent from the head of an inkjet printer device. The inkjet method uses a relatively simple process, but the yield is lowered and/or the thickness of the layer is irregular, and it is difficult to apply this method to a large-sized display device.

A method of forming an organic emission layer using a thermal transfer method as a dry etching process has also been proposed. The thermal transfer method is a method of forming R, G and B organic emission layers by converting light emitted from a light source into thermal energy, and transferring an image forming material to an insulating substrate using the thermal energy.

Laser thermal transfer technology is technology involving transfer of a color ink material using a laser, which transfers a thermal transfer element to a body by laser-irradiating the thermal transfer element. The thermal transfer element has an image transfer layer on which materials, such as dyes, paints or the like, to be transferred are applied. Therefore, a donor film is very important, the donor film being a thermal transfer element capable of stably and effectively transferring the image by means of the laser thermal transfer method, which requires much energy to transfer the image.

SUMMARY OF THE INVENTION

The present invention solves the aforementioned problems by providing a thermal transfer element capable of improving transfer characteristics by performing the thermal transfer at low energy.

The present invention separately provides a thermal transfer element capable of facilitating delamination of a light-to-heat conversion layer and preventing the characteristics of an organic thin film layer from deteriorating.

In an exemplary embodiment of the present invention, the thermal transfer element includes: a base substrate as a support substrate; a light-to-heat conversion layer formed on the base substrate to convert incident light to thermal energy; a transfer layer formed on the light-to-heat conversion layer to form an image; and a release layer formed between the base substrate and the light-to-heat conversion layer to facilitate delamination of the light-to-heat conversion layer from the base substrate.

In another exemplary embodiment according to the present invention, the thermal transfer element includes: a base substrate as a support substrate; a light-to-heat conversion layer formed on the base substrate to convert incident light to thermal energy; a transfer layer formed on the light-to-heat conversion layer to form an image; an interlayer formed between the light-to-heat conversion layer and the transfer layer to protect the light-to-heat conversion layer; and a release layer formed between the base substrate and the light-to-heat conversion layer to facilitate delamination of the light-to-heat conversion layer from the base substrate.

The release layer includes a silicon polymer having a glass transition temperature (Tg) of 25° C. or less, and a low surface energy. The release layer is one of a coating layer and a deposition layer, including a material curable by a method selected from ultraviolet (UV) curing, ambient temperature curing, low temperature curing and catalyst curing. The release layer has a thickness of 20 μm or less, preferably 5 μm or less.

The transfer layer includes an image forming material for transferring the organic thin film layer having at least an emission layer. The transfer layer includes an image forming material for transferring a plurality of organic thin film layers having at least an emission layer, and at least one layer of the plurality of organic thin film layers is patterned.

In yet another exemplary embodiment according to the present invention, an OLED comprises an organic thin film layer which includes: a base substrate as a support substrate; a light-to-heat conversion layer formed on the base substrate to convert incident light to thermal energy; a transfer layer formed on the light-to-heat conversion layer to form an image; and a release layer formed between the base substrate and the light-to-heat conversion layer to facilitate delamination of the light-to-heat conversion layer from the base substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, an exemplary embodiment of the present invention will be described in conjunction with the accompanying drawings.

Figure 1:
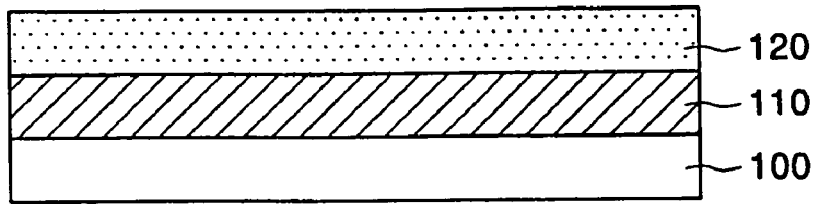
FIG. 1 is a cross-sectional view of a laser thermal transfer element for forming an organic thin film layer.

FIG. 1 is a cross-sectional view of a laser thermal transfer element for forming an organic thin film layer.

Referring to FIG. 1, the laser thermal transfer element includes a base substrate 100, a light-to-heat conversion (LTHC) layer 110, and a transfer layer 120. A method of forming an organic thin film layer uses a thermal transfer technique. Specifically, the substrate 100 and the LTHC layer 110 are closely adhered to each other so that, when laser is irradiated, the light-to-heat conversion layer 110 converts the laser light to heat so as to emit the heat, and the transfer layer 120 is transferred to the substrate 100 to form the organic thin film layer.

Although the laser thermal transfer method using the thermal transfer technique is applicable to a high resolution and large-sized display device and a micro electronic device, since the laser light is converted to heat so as to transfer the transfer layer 120 to the substrate 100, the quantity of energy converted from light to heat should be controlled.

There is adhesive strength between the base substrate 100 and the LTHC layer 110, and that is among the factors affecting the transfer energy when the organic thin film layer is formed using the thermal transfer technique. An increase in the adhesive strength between the LTHC layer 110 and the transfer layer 120 leads to an increase in the required transfer energy, and that causes an increase in the transfer temperature. When the transfer energy is high, causing the transfer temperature to be high, heat is excessively generated from the LTHC layer 110 during the transfer of the transfer layer 120, and this causes problems of transfer degradation or changes in the characteristics of the organic thin film layer.

Figure 2:
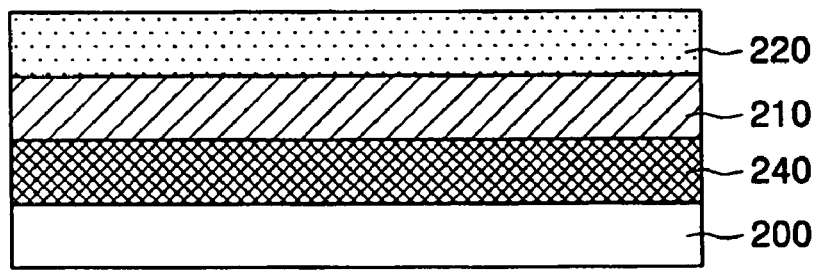
FIG. 2 is a cross-sectional view of a laser thermal transfer element for forming an organic thin film layer of an OLED in accordance with a first embodiment of the present invention.

FIG. 2 is a cross-sectional view of a laser thermal transfer element for forming an organic thin film layer of an OLED in accordance with a first embodiment of the present invention.

Referring to FIG. 2, a laser thermal transfer element in accordance with a first embodiment of the present invention includes a base substrate 200, a light-to-heat conversion (LTHC) layer 210, and a transfer layer 220. The base substrate 200 functions as a support substrate for supporting the laser thermal transfer element. The base substrate 200 is made of a transparent polymer, such as polyester, polyacryl, polyepoxy, polyethylene, polystyrene, polyethylene terephthalate or the like, and has a thickness of about 10~500 μm. The base substrate 200 may employ a substrate, such as a glass substrate, or a film.

The LTHC layer 210 absorbs light so as to convert the light to thermal energy, and it has an appropriate optical density and includes a light-absorbing material. The light-absorbing material is a material for absorbing laser light so as to generate thermal energy, and an organic binder material curable by UV light or heat. The LTHC layer 210 includes aluminum, aluminum oxide, sulfide and an infrared light-absorbing material, such as carbon black, graphite, infrared dyes, pigment or the like.

When the LTHC layer 210 is made of a metal material, the LTHC layer 210 is formed by a vacuum deposition method, an electron beam deposition method or a sputtering method, and when the LTHC layer 210 is made of an organic layer, the LTHC layer 210 is formed by a roll coating method, a spin coating method, a knife coating method, a gravure method, an extrusion method, or the like. Light for the thermal transfer may be selected from an infrared laser, a visible light laser and a UV laser.

The transfer layer 220 is made of an image forming material, corresponding to a thin film, which is to be formed on a substrate. When an organic thin film layer for an OLED is used using a thermal transfer element in accordance with a first embodiment of the present invention, the transfer layer 220 includes at least one thin film layer selected from a hole injection layer, a hole transport layer, an emission layer, a hole blocking layer, an electron transport layer and an electron injection layer. In addition, the transfer layer 220 includes a thin film layer selected from a polymer organic thin film layer and a small molecule organic thin film layer. The transfer layer 220 is formed to a thickness of about 100~50000 Å by a coating or deposition method.

The thermal transfer element in accordance with a first embodiment of the present invention further includes a release layer 240 formed between the base substrate 200 and the LTHC layer 210 to facilitate delamination of the LTHC layer 210.

The release layer 240 includes a silicon polymer having a low surface temperature. The silicon polymer is a polymer having a siloxane bond (Si—O) in a molecule, which has excellent heat resistance and chemical stability, and a glass transition temperature of 25° C. or less.

Typically, at a temperature not more than the glass transition temperature Tg, the polymer material assumes a glass state since Micro-Brownian motion of the molecules is frozen. However, at a temperature not less than the glass transition temperature, its adhesive strength becomes high since the polymer becomes flexible and has a high flexibility or elasticity. Therefore, when the release layer 240 is made of a silicon polymer having a glass transition temperature of 25° C. or less, and is formed between the substrate 200 and the LTHC layer 210, the LTHC layer 210 may be readily delaminated from the base substrate 200 by the release layer 240 at an energy lower than thermal energy required in other thermal transfer processes. In addition, since the organic thin film layer may be readily patterned by a laser thermal transfer method at a low temperature, it is possible to prevent patterning defects of the organic thin film layer due to overheating, and to improve the transfer characteristics of the organic thin film layer.

Preferably, the release layer 240 is formed to a thickness of 20 μm or less, more preferably 5 μm or less. As an additional preference, the release layer 240 is formed of a material to which wet coating is applicable, and has a thickness of 1 μm or less in consideration of uniformity or process characteristics. When a surface of the substrate, to which a predetermined pattern is transferred from the transfer layer 220 on the base substrate 200 of the thermal transfer element, is planarized, the release layer 240 preferably has a thickness of 20 µm or less. Meanwhile, when the surface of the insulating substrate, to which a predetermined pattern is transferred from the transfer layer 220 of the thermal transfer element, is stepped so as to be other than continuous, since the stepped portion and the donor film should be closed to each other in order to prevent pattern defects, the release layer 240 is formed to a thickness of 5 µm or less.

The release layer 240 is formed by a spin coating method, a roll coating method, a deep coating method, a gravure coating method, or a deposition method, and is cured by methods such as UV curing, ambient temperature curing, low temperature curing, catalyst curing and the like.

Figure 3:
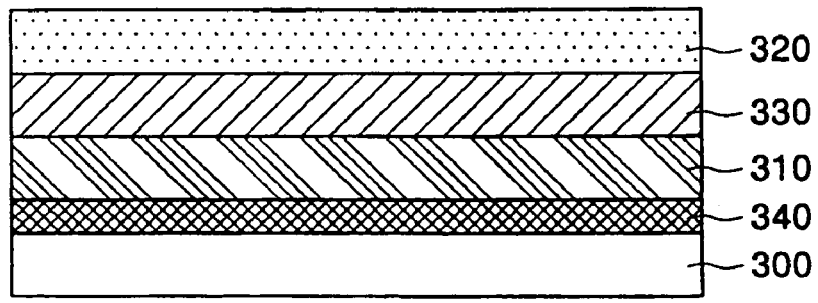
FIG. 3 is a cross-sectional view of a laser thermal transfer element for forming an organic thin film layer of an OLED in accordance with a second embodiment of the present invention.

FIG. 3 is a cross-sectional view of a laser thermal transfer element for forming an organic thin film layer of an OLED in accordance with a second embodiment of the present invention.

Referring to FIG. 3, the thermal transfer element in accordance with a second embodiment of the present invention includes a base substrate 300, a light-to-heat conversion (LTHC) layer 310, and a transfer layer 320. The base substrate 300, the LTHC layer 310 and the transfer layer 320 are formed in a manner similar to that in the first embodiment.

The thermal transfer element in accordance with a second embodiment of the present invention further includes a release layer 340 formed between the base substrate 300 and the LTHC layer 310, and an interlayer 330 formed between the LTHC layer 310 and the transfer layer 320.

The interlayer 330, preferably, has a high thermal resistance, functions to protect the LTHC layer 310, and uses an organic layer, an inorganic layer, and a stacked layer of the organic layer and the inorganic layer. Similar to the release layer 240 of the first embodiment, the release layer 340 includes a silicon polymer having low surface energy, and has a glass transition temperature of 25° C. or less. Preferably, the release layer 340 is formed to a thickness of 20 µm or less, more preferably 5 µm or less.

Figure 4:
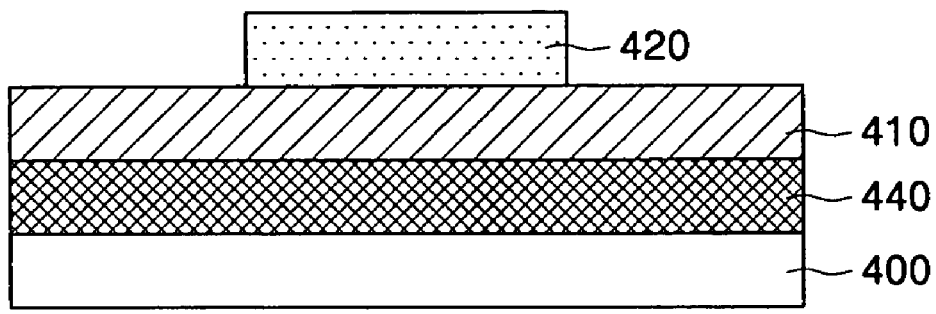
FIG. 4 is a cross-sectional view of a laser thermal transfer element for forming an organic thin film layer of an OLED in accordance with a third embodiment of the present invention.

FIG. 4 is a cross-sectional view of a laser thermal transfer element for forming an organic thin film layer an OLED in accordance with a third embodiment of the present invention.

Referring to FIG. 4, the thermal transfer element in accordance with a third embodiment of the present invention includes a base substrate 400, a light-to-heat conversion (LTHC) layer 410, and a transfer layer 420. The thermal transfer element further includes a release layer 440 formed between the base substrate 400 and the LTHC layer 410 to facilitate delamination of the LTHC layer 410 from the base substrate 400.

The base substrate 400, the LTHC layer 410 and the release layer 440 are formed in a manner similar to that in the first embodiment. Unlike the transfer layer 220 of the first embodiment, however, the transfer layer 420 is patterned. When the OLED is manufactured using the thermal transfer element in accordance with a third embodiment of the present invention, the transfer layer 420 includes at least one of a hole injection layer, a hole transport layer, an emission layer, a hole blocking layer, an electron transport layer, and an electron injection layer. In addition, the organic thin film layer includes one of a polymer organic thin film layer and a small molecule organic thin film layer. When the organic thin film layer composing the transfer layer 420 is made of a plurality of layers, the transfer layer 420 includes at least one patterned thin film layer of the plurality of organic thin film layers.

Figure 5:
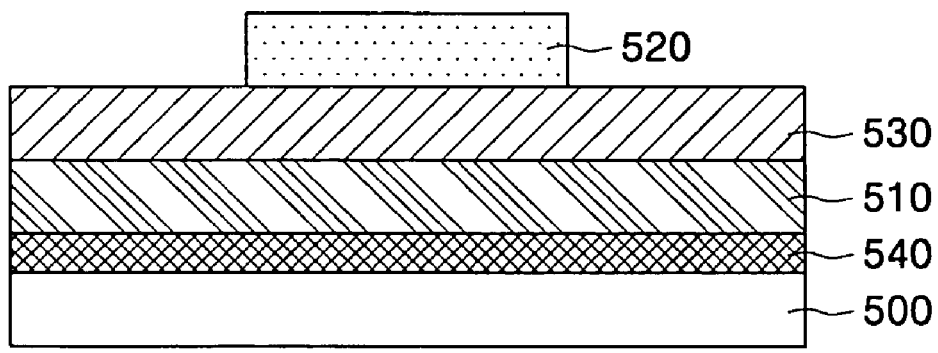
FIG. 5 is a cross-sectional view of a laser thermal transfer element for forming an organic thin film layer of an OLED in accordance with a fourth embodiment of the present invention.

FIG. 5 is a cross-sectional view of a laser thermal transfer element for forming an organic thin film layer of an OLED in accordance with a fourth embodiment of the present invention.

Referring to FIG. 5, the thermal transfer element in accordance with a fourth embodiment of the present invention includes a base substrate 500, a light-to-heat conversion (LTHC) layer 510, an interlayer 530, and a transfer layer 520. The thermal transfer element further includes a release layer 540 formed between the base substrate 500 and the LTHC layer 510 to facilitate delamination of the LTHC layer 510 from the base substrate 500.

The base substrate 500, the LTHC layer 510, the interlayer 530 and the release layer 540 are formed in a manner similar to that in the second embodiment. Unlike the transfer layer 320 of the second embodiment, the transfer layer 520 is patterned. When the OLED is manufactured using the thermal transfer element in accordance with a fourth embodiment of the present invention, the transfer layer 520 includes at least one of a hole injection layer, a hole transport layer, an emission layer, a hole blocking layer, an electron transport layer and an electron injection layer. In addition, the organic thin film layer includes one of a polymer organic thin film layer and a small molecule organic thin film layer. When the organic thin film layer composing the transfer layer 520 is made of a plurality of layers, the transfer layer 520 includes at least one patterned thin film layer of the plurality of organic thin film layers, or it may be unpatterned.

While the embodiments of the present invention describe a release layer applied to the thermal transfer element, in which the LTHC layer and the transfer layer are deposited on the base substrate, and in which the LTHC layer, the interlayer and the transfer layer are deposited on the base substrate, the thermal transfer element is not limited thereto. Therefore, various structured thermal transfer elements can be applied to a structure for facilitating delamination of the LTHC layer from the base substrate in accordance with the invention.

In accordance with the embodiments of the present invention, the thermal transfer element includes the release layer between the base substrate and the LTHC layer to facilitate delamination of the LTHC layer from the base substrate and to enable thermal transfer at a low temperature, thereby improving transfer characteristics. In addition, the present invention provides the capability of preventing defects due to overheating, and prevents the characteristics of the organic emission layer from deteriorating.

Although the present invention has been described with reference to certain exemplary embodiments thereof, it will be understood by those skilled in the art that a variety of modifications and variations may be made to the present invention without departing from the spirit or scope of the present invention as defined in the appended claims, and their equivalents.

What is claimed is:

1. A thermal transfer element, comprising:
    a base substrate as a support substrate;
    a light-to-heat conversion layer formed on the base substrate to convert incident light to thermal energy;
    a transfer layer formed on the light-to-heat conversion layer to form an image; and
    a release layer formed between the base substrate and the light-to-heat conversion layer to facilitate delamination of the light-to-heat conversion layer from the base substrate.

2. The thermal transfer element according to claim 1, wherein the release layer comprises a material having a glass transition temperature Tg not greater than 25° C.

3. The thermal transfer element according to claim 2, wherein the release layer comprises a silicon polymer having a low surface energy.

4. The thermal transfer element according to claim 3, wherein the release layer is one of a coating layer and a deposition layer.

5. The thermal transfer element according to claim 4, wherein the release layer is formed of a material curable by a method selected from ultraviolet curing, ambient temperature curing, low temperature curing, and catalyst curing.

6. The thermal transfer element according to claim 1, wherein the release layer has a thickness not greater than 20 μm.

7. The thermal transfer element according to claim 6, wherein the release layer has a thickness in a range of 1~5 μm.

8. The thermal transfer element according to claim 1, wherein the transfer layer comprises an image forming material for transferring an organic thin film layer having at least an emission layer.

9. The thermal transfer element according to claim 1, wherein the transfer layer comprises an image forming material for transferring a plurality of organic thin film layers having at least an emission layer.

10. The thermal transfer element according to claim 9, wherein at least one layer of the plurality of organic thin film layers is patterned.

11. A thermal transfer element, comprising:
a base substrate as a support substrate;
a light-to-heat conversion layer formed on the base substrate to convert incident light to thermal energy;
a transfer layer formed on the light-to-heat conversion layer to form an image;
an interlayer formed between the light-to-heat conversion layer and the transfer layer to protect the light-to-heat conversion layer; and
a release layer formed between the base substrate and the light-to-heat conversion layer to facilitate delamination of the light-to-heat conversion layer from the base substrate.

12. The thermal transfer element according to claim 11, wherein the release layer comprises a material having a glass transition temperature Tg not greater than 25° C.

13. The thermal transfer element according to claim 12, wherein the release layer comprises a silicon polymer having a low surface energy.

14. The thermal transfer element according to claim 13, wherein the release layer is one of a coating layer and a deposition layer.

15. The thermal transfer element according to claim 14, wherein the release layer is formed of a material curable by a method selected from ultraviolet curing, ambient temperature curing, low temperature curing, and catalyst curing.

16. The thermal transfer element according to claim 11, wherein the release layer has a thickness not greater than 20 μm.

17. The thermal transfer element according to claim 16, wherein the release layer has a thickness not greater than 5 μm.

18. The thermal transfer element according to claim 11, wherein the transfer layer comprises an image forming material for transferring an organic thin film layer having at least an emission layer.

19. The thermal transfer element according to claim 11, wherein the transfer layer comprises an image forming material for transferring a plurality of organic thin film layers having at least an emission layer, and wherein at least one layer of the plurality of organic thin film layers is patterned.

* * * * *